United States Patent [19]

Pedersen

[11] Patent Number: 5,604,453

[45] Date of Patent: Feb. 18, 1997

[54] CIRCUIT FOR REDUCING GROUND BOUNCE

[75] Inventor: Bruce B. Pedersen, San Jose, Calif.

[73] Assignee: Altera Corporation, San Jose, Calif.

[21] Appl. No.: 301,511

[22] Filed: Sep. 7, 1994

Related U.S. Application Data

[63] Continuation-in-part of Ser. No. 52,356, Apr. 23, 1993, abandoned.

[51] Int. Cl.[6] .......................... H03B 1/00; H03K 19/094
[52] U.S. Cl. ........................ 327/112; 327/384; 326/83
[58] Field of Search .......................... 326/56, 57, 58, 326/83, 23, 24, 27; 327/108, 112, 385, 384, 404

[56] References Cited

U.S. PATENT DOCUMENTS

| | | | |
|---|---|---|---|
| 4,363,978 | 12/1982 | Heimigner | 307/451 |
| 4,612,466 | 9/1986 | Stewart | 307/585 |
| 4,621,208 | 11/1986 | Van Tran | 326/58 |
| 4,855,623 | 8/1989 | Flaherty | 307/475 |
| 4,862,018 | 8/1989 | Taylor et al. | 327/384 |
| 4,952,818 | 8/1990 | Erdelyi et al. | 326/56 |
| 4,963,766 | 8/1992 | Lundberg | 307/451 |
| 5,008,568 | 4/1991 | Leung et al. | 307/451 |
| 5,036,222 | 7/1991 | Davis | 326/58 |
| 5,036,232 | 7/1991 | Jungert et al. | 307/448 |
| 5,055,714 | 10/1991 | Obregon | 307/443 |
| 5,107,142 | 4/1992 | Bhamidipaty | 326/56 |
| 5,124,579 | 7/1992 | Naghshineh | 307/443 |
| 5,148,056 | 9/1992 | Glass et al. | 307/443 |
| 5,173,627 | 12/1992 | Lien | 326/57 |
| 5,194,764 | 3/1993 | Yano et al. | 326/58 |
| 5,315,187 | 5/1994 | Cheng | 327/384 |
| 5,389,834 | 2/1995 | Kinugasa et al. | 326/58 |

OTHER PUBLICATIONS

Weste, et al., "Principles of CMOS VLSI Design", Addison-Wesley Publishing Company, 1988, pp. 55–57.

*Primary Examiner*—Timothy P. Callahan
*Assistant Examiner*—My-Trang Nu Ton
*Attorney, Agent, or Firm*—Townsend and Townsend and Crew, LLP

[57] ABSTRACT

A device and method of reducing ground bounce using a CMOS driver 200. The driver includes a first CMOS pass gate 214 and a second CMOS pass gate 222. The first pass gate is used to drive the gate of a PMOS pull-up transistor 210, while the second pass gate is used to drive the gate of an NMOS pull-down transistor 218.

15 Claims, 10 Drawing Sheets

FIG. 2

CIRCUIT FOR REDUCING GROUND BOUNCE

This application is a continuation-in-part of application Ser. No. 08/052,356 filed Apr. 23, 1993, now abandoned.

BACKGROUND OF THE INVENTION

This invention relates generally to semiconductor integrated circuits and more particularly, it relates to a CMOS output driver circuit for reducing ground bounce.

Output drivers are commonly used within integrated circuits to couple data or control signals to external pins, thus coupling external devices to the integrated circuit. A CMOS output driver typically includes an output stage comprised of an NMOS and PMOS transistor. Referring to the output stage illustrated in FIG. 1, a PMOS transistor 110, the pull-up transistor, is connected between a high voltage source $V_{cc}$ (e.g., 5 volts) and an output terminal 112. When the pull-up transistor 110 is switched on by a low signal at its associated control gate, a logic high value is provided through the transistor's low impedance path to the output terminal 112 to drive signal-receiving circuitry 113. An NMOS transistor 116, the pull-down transistor, is connected between the output terminal 112 and ground. When the pull-down transistor 116 is switched on by a high signal at its associated control gate, the output of the terminal 112 is connected to ground through the transistor's low impedance path providing a low logic signal to the signal-receiving circuitry.

A common problem associated with output drivers is the occurrence of a phenomenon known as "ground bounce." Ground bounce occurs as a result of the parasitic inductance of the integrated circuit and packaging interconnect, and is a particular problem in integrated circuits that use high speed transistors. Stray inductances associated with the package interconnect are associated in part to the wire bonding, lead frame, and other sources. For purposes of illustration, the inductor 118 represents the stray inductances in the power path and the inductor 120 represents the stray inductances in the ground path. The capacitive reactance of the output driver load is represented in FIG. 1 by the capacitor 122.

Ground bounce occurs when the pull-down transistor switches from an off state to an on state. Referring to FIG. 1, when the pull-down transistor 116 is turned on the potential developed across the capacitor 122 is coupled by the transistor 116 across inductor 120. As a consequence, a transient (ground bounce) is generated across inductor 120. A surge of current flows from the output terminal 112 through the pull-down transistor 116 and through the parasitic inductance 120 to ground. Since the voltage across an inductance is directly proportional to the derivative of the current with respect to time, the voltage at the source of the pull-down transistor rises. This in turn decreases the gate-to-source voltage of the pull-down transistor. In the case where the pull-down transistor turns on very quickly, the derivative of current with respect to time is high and thus a relatively large decrease in gate-to-source voltage results. This decrease in gate-to-source voltage, caused by ground bounce, causes ringing and an increase in the overall propagation delay of the output buffer and can cause corruption of the internal logic. A symmetrical problem arises at transistor 110 when the driver output changes from ground to $V_{cc}$. This effect is herein referred to as "$V_{cc}$ bounce."

Ground bounce and $V_{cc}$ bounce can cause problems in the quality of the signal driven by the driver circuits and can act to reduce the speed at which the circuit may effectively be operated. Bounce can also cause problems by creating noise in the power supply signal that is bussed throughout the circuit. This noise occurs as fluctuations in the voltage level $V_{cc}$ available on the power buss and can degrade overall circuit performance.

Modifications to the output driver have been made to decrease ground bounce. U.S. Pat. No. 5,124,579 to Naghshineh minimizes ground bounce by including a resistive means connected in series with certain gates of the transistors in the pull-up driver and pull-down driver to form RC delay circuits for limiting the rate of rise of the source voltage. U.S. Pat. No. 5,148,056 to Glass et al. minimizes ground bounce by coupling a feedback means to the output terminal of the output buffer. The feedback circuit provides a feedback voltage to the gate of the pull-down transistor to regulate the derivative of source current with respect to time.

From the above it is seen that an improved output driver is desired.

SUMMARY OF THE INVENTION

A CMOS driver circuit that can drive high capacitance loads faster and with less ground bounce than conventional CMOS drivers is provided. Ground bounce is reduced by reducing the inductive loading of the CMOS driver circuit compared to conventional CMOS drivers. Inductive loading is reduced by driving the gate of the large N-channel pull-down transistor through a CMOS pass gate.

Ground bounce voltage ("$V_{gb}$") is approximately proportional to the inductance (L) of the leads in an integrated circuit multiplied by the rate of change in the current (I') drawn through the external leads. Although it is desirable to reduce the ground bounce voltage, the time it takes for output voltage to change is minimized when the rate of change of current is as large as possible.

To maximize speed while minimizing ground bounce, it is thus desirable that the rate of current change be approximately a constant ($I_o'$) such that $I_o'=V_{gbmax}/L$, where $V_{gbmax}$ is the maximum allowable ground bounce. Since the current through an NMOS transistor is roughly proportional to the square of the gate-to-source voltage $V_{gs}$ in excess of the transistor's threshold voltage $V_{th}$, the rate of current change through an NMOS transistor is roughly proportional to the rate of change of the gate-to-source voltage $V_{gs}'$ multiplied by ($V_{gs}-V_{th}$). Therefore, the rate of change of the current I' can be made approximately constant if the rate of change of the voltage $V_{gs}'$ of the NMOS transistor is inversely proportional to about ($V_{gs}-V_{th}$). The gate-to-source voltage of such an NMOS transistor is, according to this invention, changed at a rate inversely proportional to about $V_{gs}-V_{th}$ by driving the NMOS transistor gate through a bootstrapped NMOS pass device in parallel with a PMOS pass device.

According to the invention, the relative sizes of the NMOS pass device and the PMOS pass device with which it is in parallel are critical in achieving the desired ground bounce characteristics. If, when driving the output pin to ground, it is found that the ground bounce peaks early and then decreases, then the size of the NMOS pass device needs to be decreased and the size of the PMOS device needs to be increased. If, however, when driving the output pin to ground, it is found that the ground bounce starts out low and then gradually increases to a peak, then the size of the PMOS pass device needs to be decreased and the size of the NMOS pass device needs to be increased. If the amount of ground bounce is constant but too large, the sizes of both pass devices should be decreased proportionally.

In a specific embodiment, the CMOS driver circuit is comprised of an NMOS pull-down transistor, whose gate couples to a CMOS pass gate device and an NMOS transistor, and a PMOS pull-up transistor whose gate connects to a CMOS pass gate device and a PMOS transistor. The circuit is driven by a tri-state output enable ("OE") instead of a conventional OE circuit. The gates of the NMOS and PMOS pass transistors connect to an output enable signal OE and its inverse respectively, through small inverting buffers that serve to isolate the gate capacitance of the pass transistors from the line capacitance of the OE signal. The OE and inverse OE signals also respectively drive the gate terminals of PMOS and NMOS transistors whose drain terminals connect to the gates of the PMOS pull-up and NMOS pull-down transistors, respectively. The source terminals of PMOS and NMOS transistors connect to a supply voltage and ground, respectively. Therefore, the circuit can be used as a tri-state driver. Thus, implementing a tri-state driver does not require extra devices in the speed path of the circuit.

Accordingly, in one embodiment, the invention includes an NMOS pull-down transistor, the NMOS pull-down transistor having a drain coupled to an output of the output driver and a source coupled to ground; a PMOS pull-up transistor, the PMOS pull-up transistor having a source coupled to a voltage supply and a drain coupled to the output of the circuit; a pass transistor coupled to a gate of the NMOS pull-down transistor, the pass transistor having a first terminal coupled to the gate of the NMOS pull-down transistor and a second terminal coupled to an input of the output buffer; and an output enable input coupled to a gate of the pass transistor, wherein a rate of change of the gate voltage of the NMOS pull-down transistor is approximately inverse to the gate voltage when the pull-down transistor is active.

According to a further embodiment of the invention, the output driver is effectively used in an integrated circuit along with a quiet power supply and a noisy power supply. In some types of integrated circuits, such as programmable logic devices, it is desirable to isolate any noise generated by the driver circuit from the quiet power supply. According to this embodiment, the noisy power supply is used at the sources of the pull-up and pull-down transistors while other elements of the circuit utilize the quiet power supply.

A further understanding of the nature and advantages of the invention may be realized by reference to the remaining portions of the specification and the drawings.

DESCRIPTION OF SPECIFIC EMBODIMENTS

Figure 1:
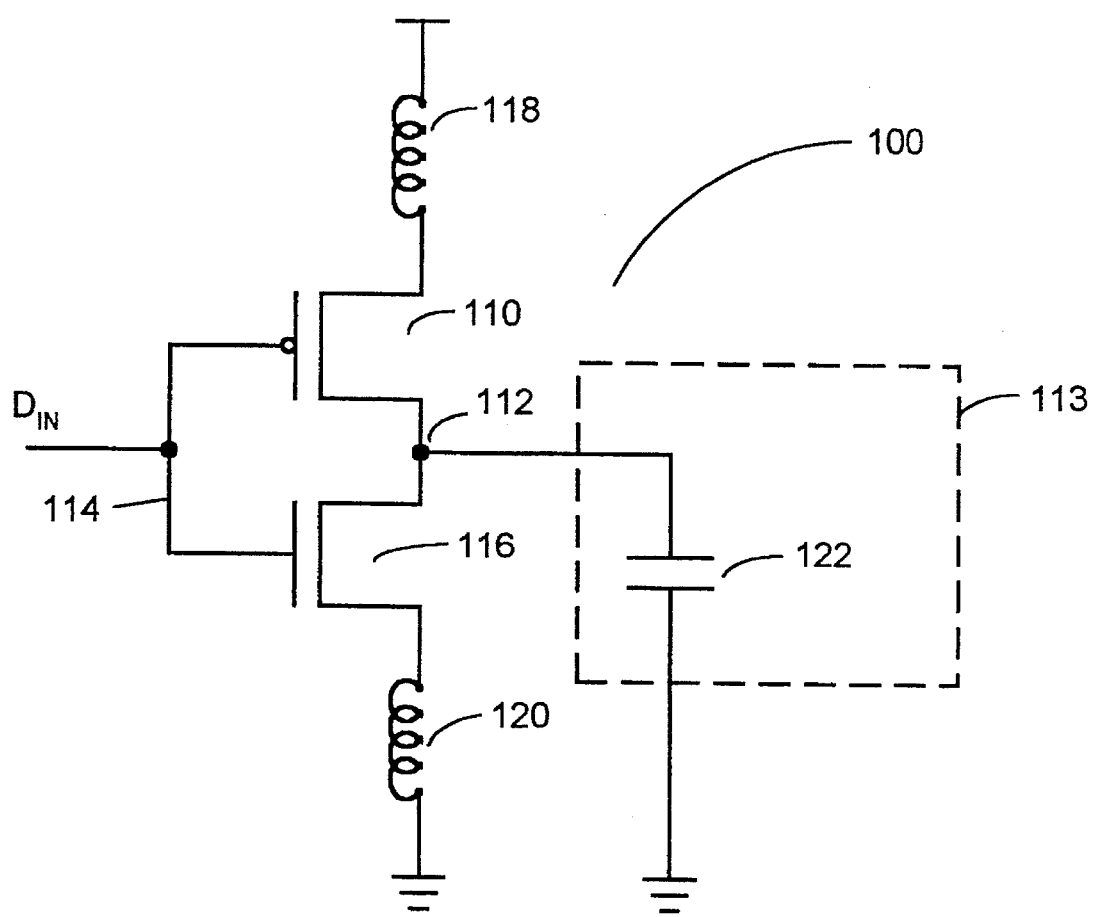
FIG. 1 is a schematic drawing of a prior art output driver circuit.
Figure 2:
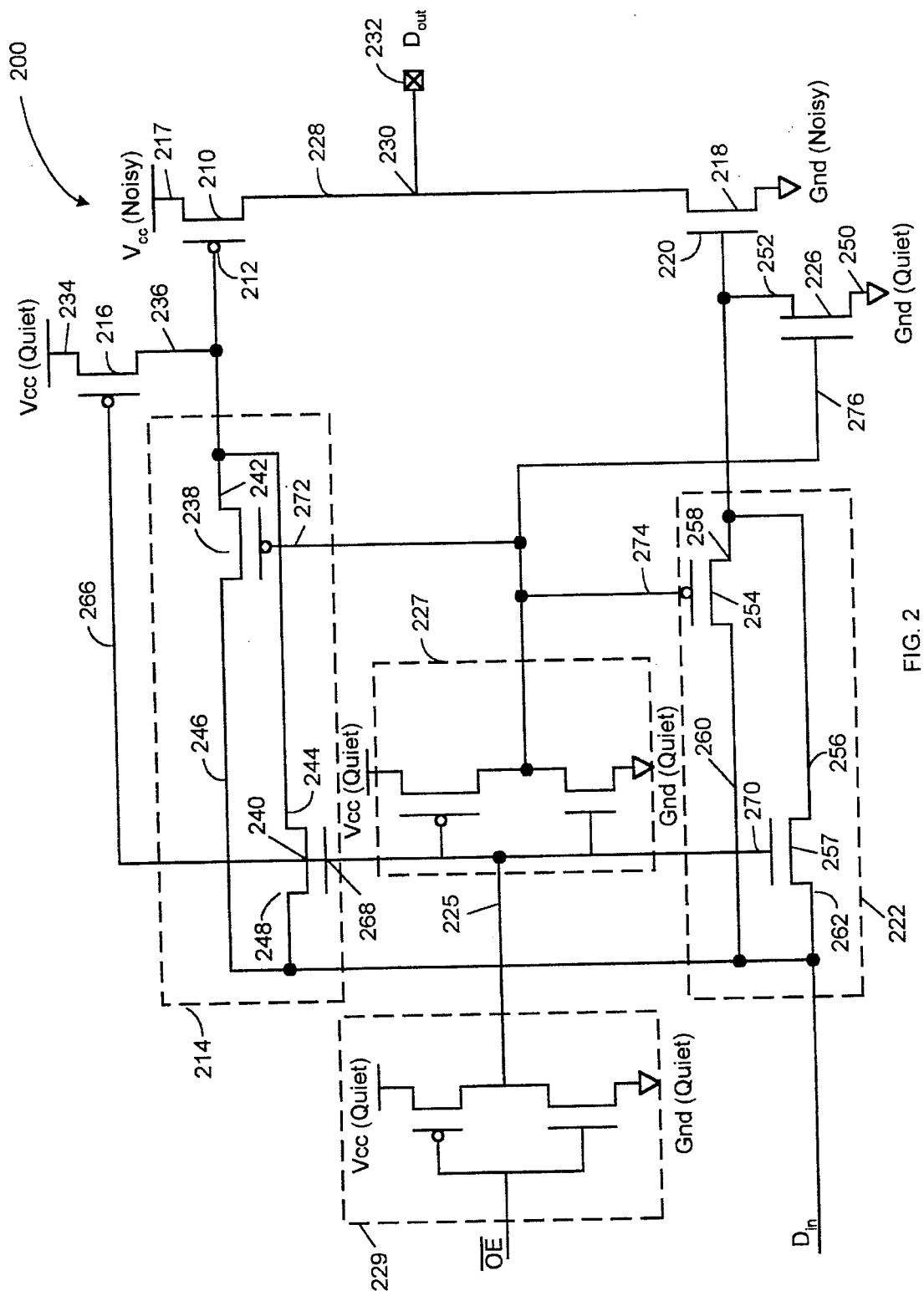
FIG. 2 is a schematic drawing of the circuit for reducing ground bounce according to the present invention.

FIG. 2 shows a schematic circuit drawing of a CMOS driver circuit 200 according to the present invention. The CMOS driver circuit 200 is comprised of a PMOS pull-up transistor 210. The gate 212 of the PMOS pull-up is coupled to the output of a CMOS pass gate device 214 and the drain 236 of a PMOS transistor 216. An NMOS pull-down transistor 218 has a gate 220 coupled to the output of a CMOS pass gate device 222 and the drain 252 of an NMOS transistor 226. The source 217 of the PMOS transistor 210 connects to a first power supply voltage $V_{cc(Noisy)}$, typically in the 3- to 5-volt range. The drain 228 of the PMOS transistor 210 connects to the drain of the NMOS transistor 218 at an output node 230. The output node 230 connects to an external output terminal pin 232 via a lead connection.

The CMOS pass gate device 214 is comprised of a PMOS transistor 238 and an NMOS transistor 240. The terminal 242 of the PMOS transistor connects to the terminal 244 of the NMOS transistor at the output of the CMOS pass gate. Similarly, the terminal 246 of the PMOS transistor connects to the terminal 248 of the NMOS transistor at the input of the CMOS pass gate. The input of the CMOS pass gate 214 couples to the inverted input $D_{in}$ of the driver. $D_{in}$ may be from, for example, the output of a programmable logic circuit.

The source 250 of the NMOS transistor 226 connects to ground while the drain 252 of the NMOS transistor 224 connects to the gate 220 of the PMOS transistor 218 and the output of CMOS pass gate 222. The CMOS pass gate device 222 is comprised of a PMOS transistor 254 and an NMOS transistor 257. Terminal 258 of the PMOS transistor 254 and terminal 256 of the NMOS transistor 257 connect to the output of CMOS pass gate 222. Similarly, terminal 260 of the PMOS transistor 254 and terminal 262 of the NMOS transistor 257 connect to the input of the CMOS pass device 222 and the input $D_{in}$ of the driver.

The gates 266, 268, and 270 of the MOS transistors 216, 240, and 257, respectively, connect to an output enable signal OE via invertor 229. The gates 272, 274, and 276 of the MOS transistors 238, 254, and 226 connect to the inverse of the output enable signal via inverter 227.

The static operation of the circuit is as follows. When OE is low, transistors 216 and 226 are conductive. Accordingly, transistors 210 and 218 are off, and the output, $D_{out}$ is in a tri-state condition, i.e., the input does not affect the output. When OE is high, the transistors 216 and 226 are not conductive, and permit the input to control the output.

Specifically, when output enable is high and $D_{in}$ is high, the transistors 238, 240, 254, and 257 will be conductive and $D_{in}$ is transmitted to the gates of the pull-up/pull-down transistors 210/218. Since $D_{in}$ is high, transistor 218 is conductive and transistor 210 is not. Therefore, $D_{out}$ is inverted with respect to $D_{in}$ and is pulled low by NMOS pull-down transistor 218. Conversely, when $D_{in}$ is low, transistor 210 is conductive and transistor 218 is not. Therefore, $D_{out}$ is pulled high by pull-up transistor 210.

Figure 3:
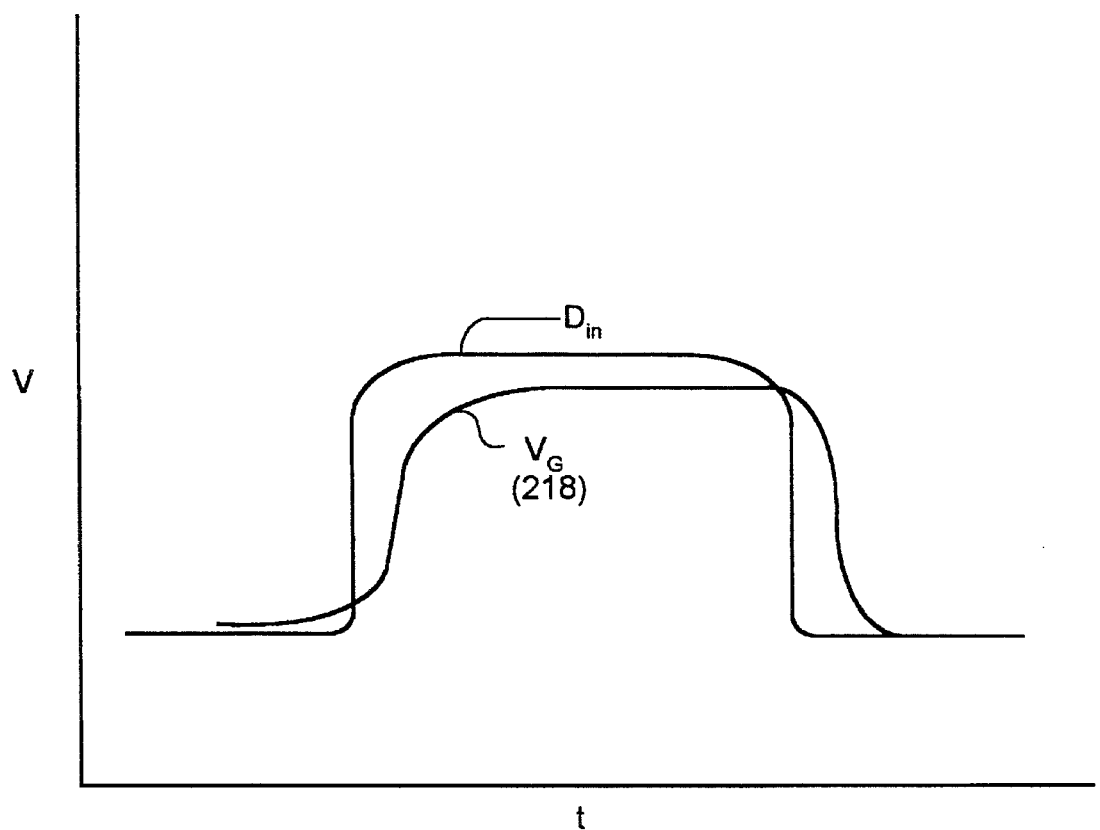
FIG. 3 illustrates the gate voltage on transistor 218 as $D_{in}$ changes.

The dynamic operation of the circuit in response to changes in the input signal $D_{in}$ will now be described. The overall desired dynamic performance characteristic of the driver is to have the output signal $D_{out}$ change as rapidly as possible in response to a change in the input signal $D_{in}$ while holding ground bounce and $V_{cc}$ bounce at an acceptable minimum level. FIG. 3 illustrates the voltage on the gate of transistor 218 according to the invention as $D_{in}$ changes from a low value to a high value when output enable is asserted. As shown, the value of $V_{gs}$ initially changes rapidly, but the rate of change gradually drops off. Accordingly, the rate of change of the gate voltage varies qualitatively with the inverse of the gate voltage. Therefore, the rate of change of current through the NMOS transistor 218 is approximately a constant, and a relatively low value. Accordingly, concerns with ground bounce will be minimized.

As described above, this desired characteristic performance is acheived when the rate of change of the current I' through pull-down transistor 218 is made approximately constant by making the rate of change of the voltage $V_{gs}'$ of the NMOS transistor 218 inversely proportional to about $(V_{gs}-V_{th})$. The invention uses two techniques to make the gate-to-source voltage of NMOS transistor 218 change at a rate inversely proportional to about $V_{gs}-V_{th}$. The first is use of a circuit configuration whereby the gate of 218 is driven by pass transistors which are "bootstrapped" when Din initially changes from 0 to +1. The second is use of NMOS pass device 257 in parallel with PMOS pass device 254 where the abosolute and relative sizes of the pass devices are carefully selected so that the sum of the currents through the two pass devices approximates the desired current characteristics.

Figure 4:
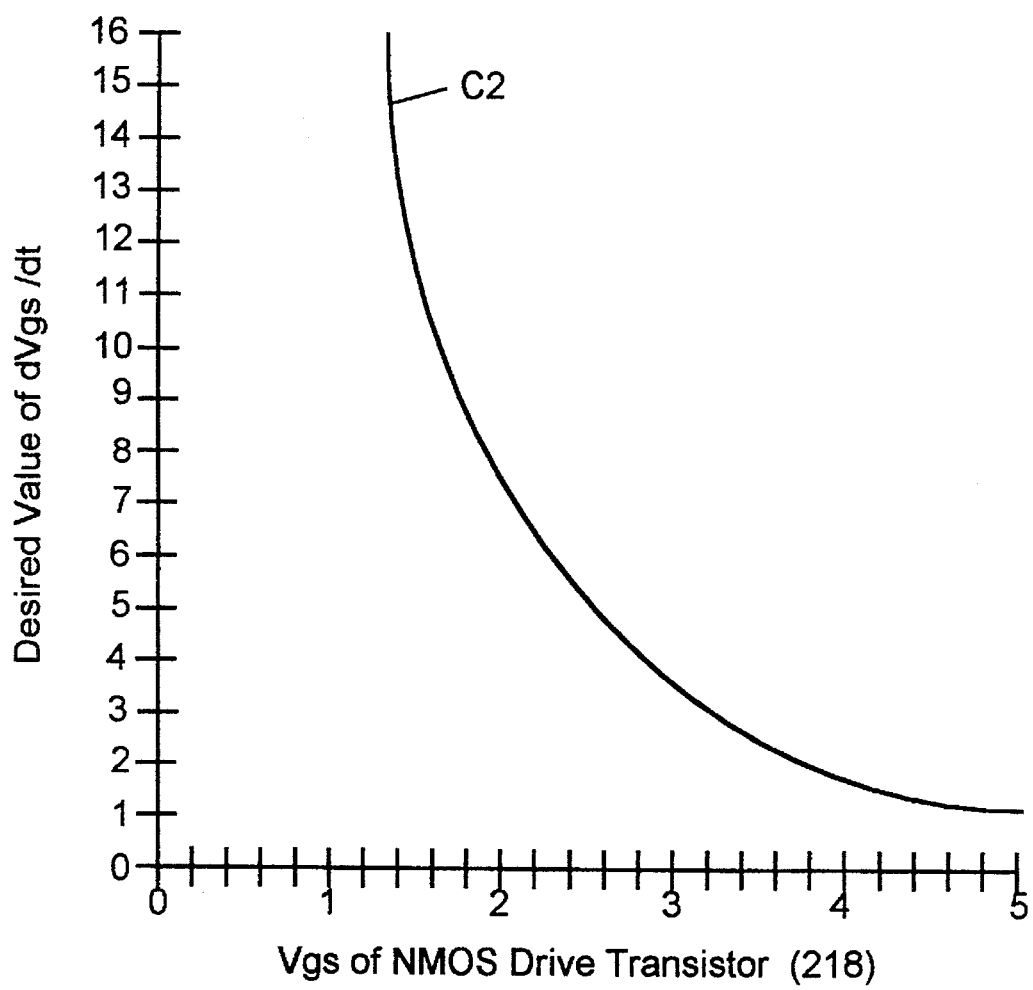
FIG. 4 illustrates the desired value of $dV_{gs}/dt$ at the NMOS drive transistor.

FIG. 4 illustrates the desired characteristic of $V_{gs}'$ proportional to one over $V_{gs}-V_{th}$ on device 218 to achieve minimal ground bounce. Curve c2 can be thought of as the target $V_{gs}'$ that the invention is trying to achieve. FIGS. 5–8 illustrate how the invention uses pass devices 254, 257, and other circuit elements to approximate this characteristic.

Figure 5:
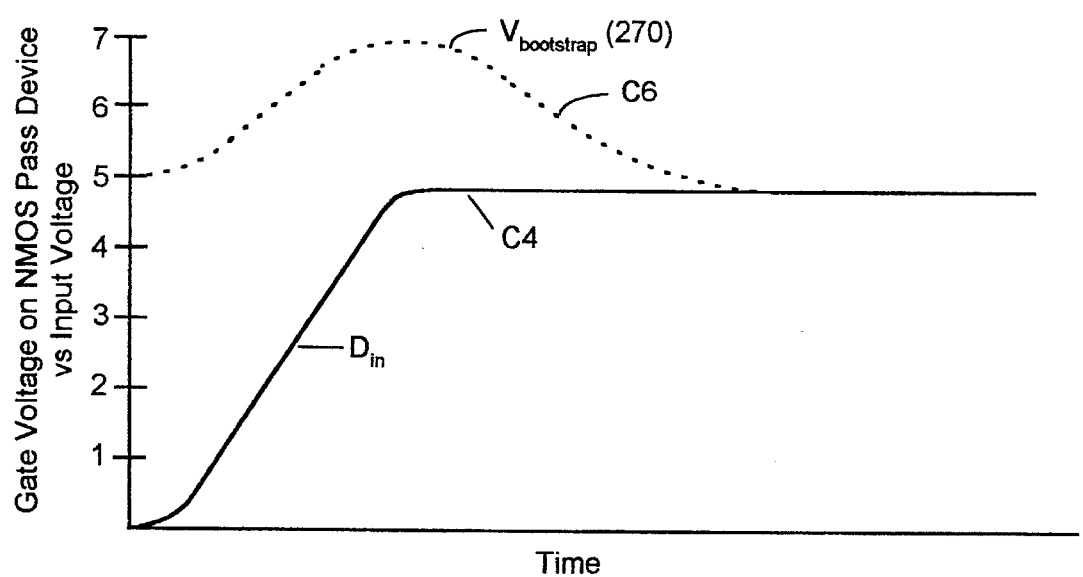
FIG. 5 illustrates the gate voltage on the pass transistors as a function of time.

FIG. 5 illustrates the effect of bootstrapping on the gate voltage of pass transistor 257. According to the invention, the sizes of inverters 227 and 229 are selected such that the parasitic capacitance they contribute to node 225 is small in comparison to the gate-to-source capacitance of transistor 257. Therefore an increasing voltage on the source of transistor 257 due to a rise in $D_{in}$ (shown as curve c4) from 0 to a logical +1 voltage will couple back to node 225 temporarily and will "bootstrap" the voltage at gate 270 (shown as curve c6) temporarily above $V_{cc}$. This bootstrap effect will allow a maximum current to flow through transistor 257 at exactly the time that $D_{in}$ is changing most rapidly and so will help to quickly turn-on pull-down transistor 218 when $D_{in}$ changes. The bootstrap excess voltage at node 225 quickly drains from the node and the voltage returns to $V_{cc}$ before $D_{out}$ reaches full voltage. Therefore, the bootstrap effect does not significantly increase the ground bounce.

The dynamic operation of the circuit is also affected by the relative sizes of the NMOS pass devices 257 and 240 to their corresponding PMOS pass devices 238 and 254. To the extent that the size of the NMOS pass device 257 is smaller and the size of the PMOS pass device 254 is larger, the peak in the ground bounce will be delayed and will tend to increase over time. The size of both pass devices will determine the overall size of the ground bounce, with larger pass transistors tending to cause more ground bounce.

Figure 6:
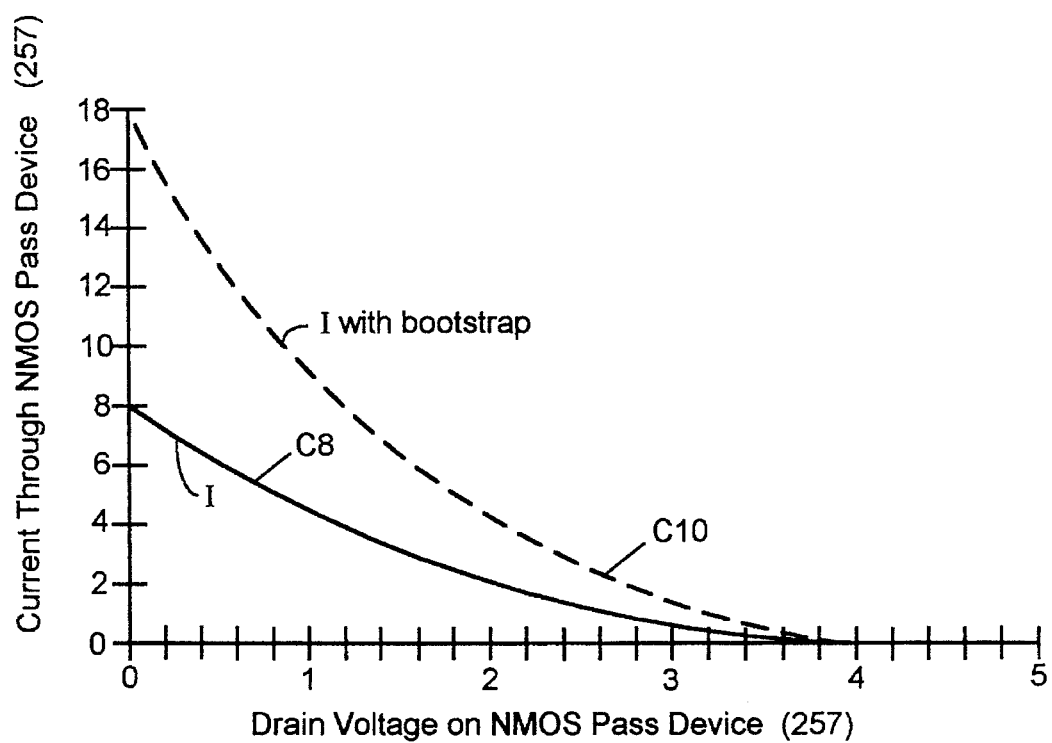
FIG. 6 illustrates the current through the NMOS pass transistor as a function of time.
Figure 7:
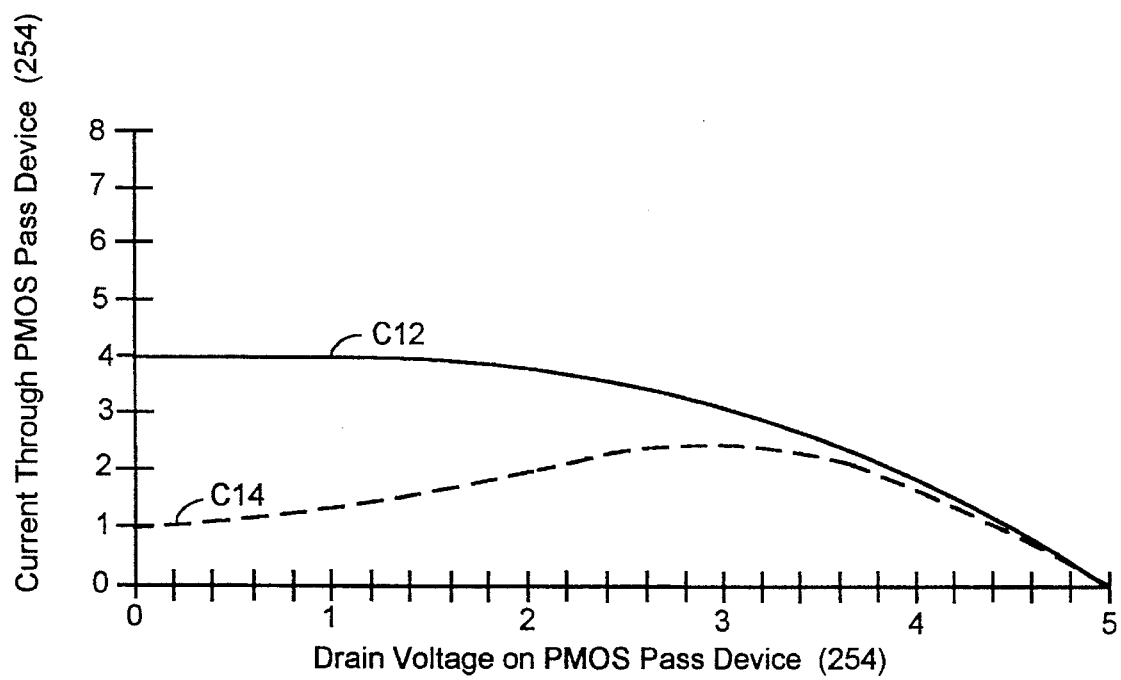
FIG. 7 illustrates the current through the PMOS pass transistor as a function of time.
Figure 8:
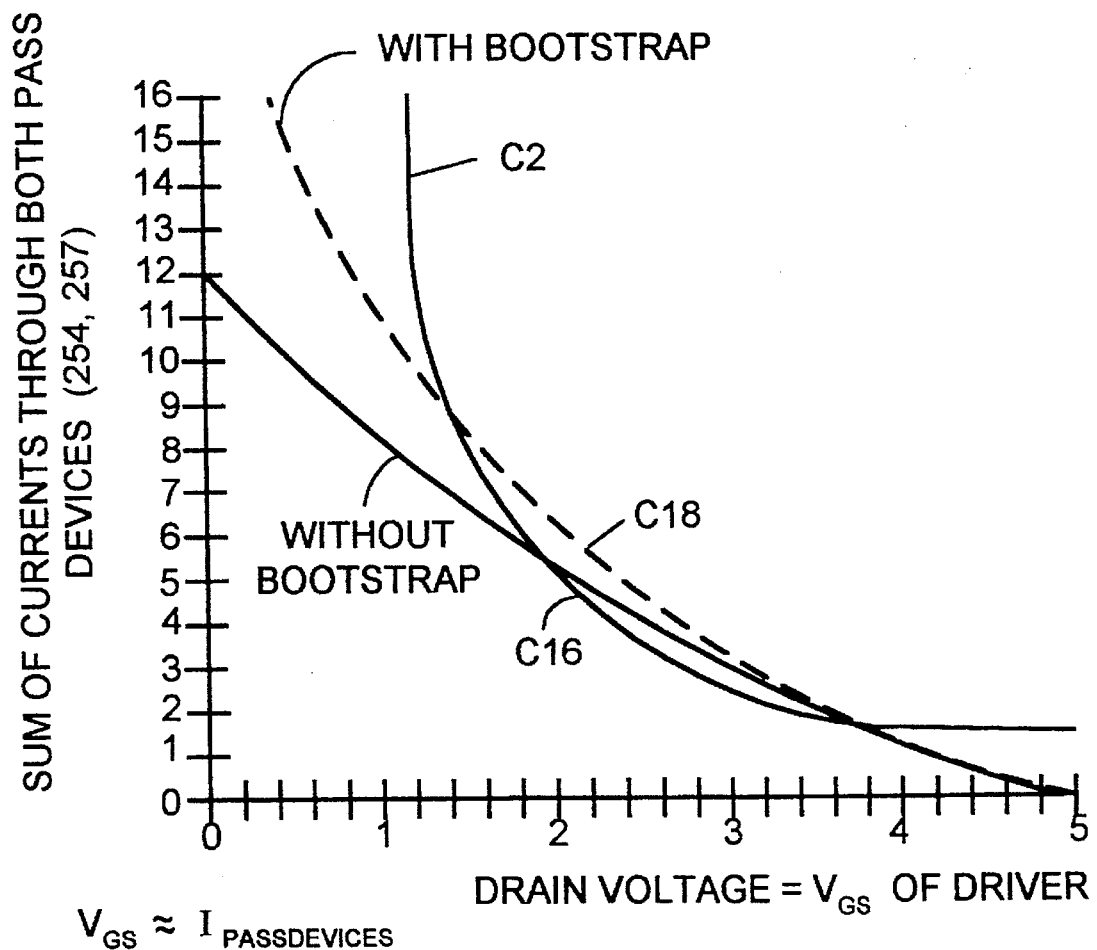
FIG. 8 illustrates the sum of the currents through the PMOS and NMOS pass transistors as a function of time.

FIG. 6 illustrates the current through pass device 257 both without the effect of bootstrapping voltage (curve c8) and with the bootstrapping voltage (curve c10). The overall amount of current and therefore the height of these two curves is determined largely by the size of transistor 257. FIG. 7 illustrates the current through pass device 254 both without the effect of bootstrapping voltage (curve c12) and with the bootstrapping voltage (curve c14). The overall amount of current and therefore the height of these two curves is determined largely by the size of transistor 254. FIG. 8 shows the resultant sum of these two pass device currents both without bootstrap (curve c16) and with bootstrap (curve c18) and for comparison shows target curve c2.

It may be seen by reference to FIGS. 6–8 that the sum of the currents through pass devices 257 and 254 (curve c18) can be made to approximate the desired ideal current characteristics (curve c2) by selecting appropriate sized transistors for devices 257 and 254. If; when driving the output pin to ground, it is found that the ground bounce peaks early and then decreases, then the size of the NMOS pass device needs to be decreased and the size of the PMOS device needs to be increased. If, however, when driving the output pin to ground, it is found that the ground bounce starts out low and then gradually increases to a peak, then the size of the PMOS pass device needs to be decreased and the size of the NMOS pass device needs to be increased. If the amount of ground bounce is constant but too Marge, the sizes of both pass devices should be decreased proportionally.

According to one specific embodiment, the invention may include provisions for providing a "quiet" power supply and a "noisy" power. This aspect of the invention is particularly important in programmable logic device applications. According to this embodiment, the invention provides a circuit with a quiet power supply and a noisy power supply. Because sourcing driver transistors is a main cause of noise in a power supply, the noisy power supply $V_{cc}$(Noisy) is used at the sources of transistors 210 and 218 and, optionally, as a power supply to inverter 227. Other elements of the circuit utilize the quiet power supply $V_{cc}$(Quiet). With this configuration, noise caused by the driving circuit is isolated from the quiet power supply and therefore does not disturb the other devices on the integrated circuit.

Figure 9:
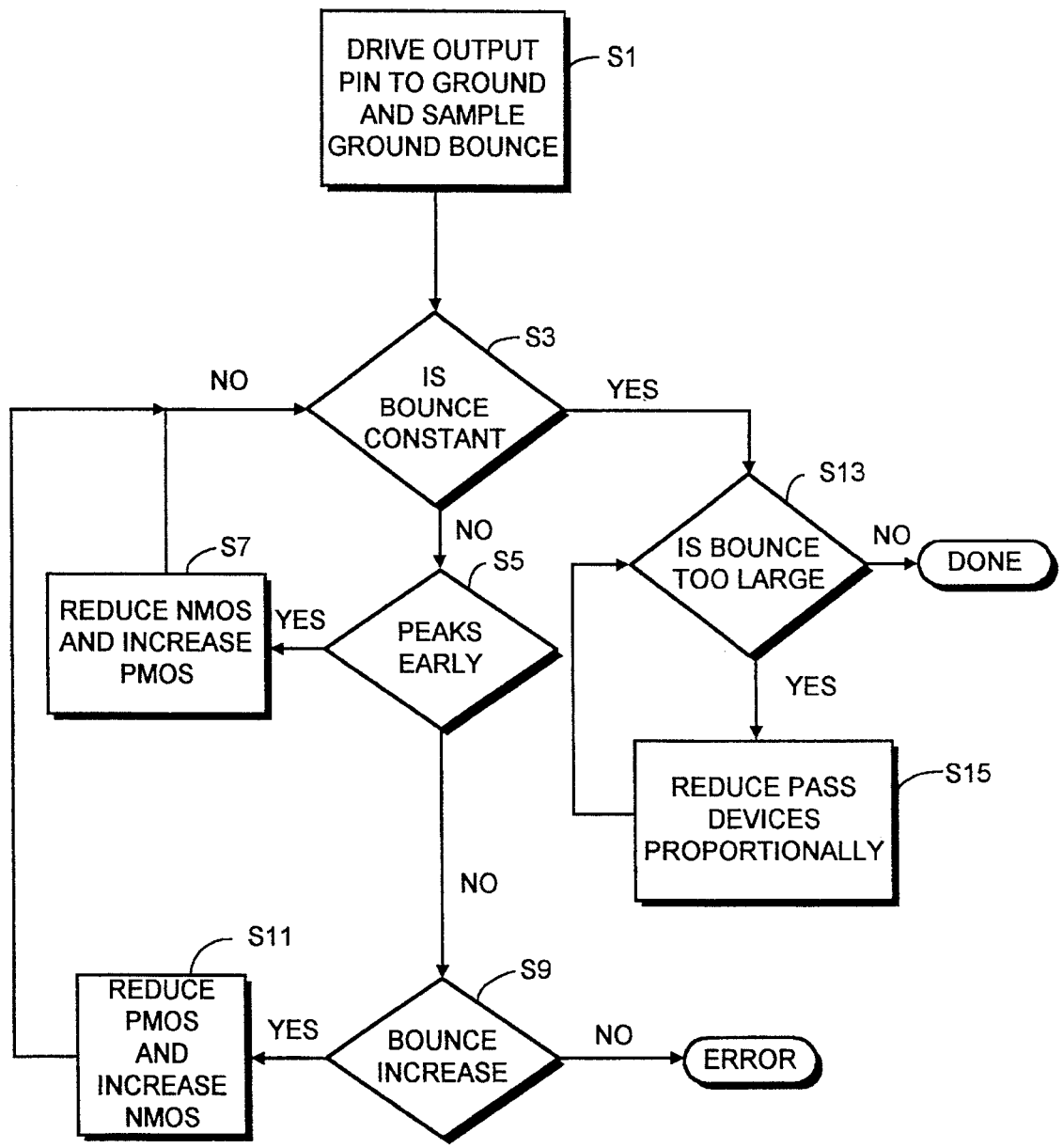
FIG. 9 is a flow chart illustrating a method for selecting the sizes of the NMOS and PMOS pass devices according to the invention.

FIG. 9 is a flow chart of a method for determining the sizes of pass transistors 238, 240, 254 and 257. In designing the circuit 200 according to the invention, it will be found that the relative sizes of the NMOS pass devices 257 and 240 to their corresponding PMOS pass devices 238 and 254 are critical in achieving the desired ground bounce characteristics. According the method, the circuit is set to drive output pin 232 to ground and the bounce on pin 232 is sampled (Step S1). The method next determines if the ground bounce is constant (Step S3). If the bounce is found not to be a constant, the method then examines the dynamic characteristics of the bounce signal. If the sampling determines that the ground bounce peaks early and then decreases (Step S5), then the size of the NMOS pass device 257 is decreased and the size of the PMOS pass device 254 is increased (Step S7). If the sampling determines that the ground bounce starts out low and then gradually increases to a peak (Step S9), then the size of the PMOS pass device 254 needs to be decreased and the size of the NMOS pass device 257 needs to be increased (Step S11). According to the method, this process loops through Step S3 iteratively until it is found that the ground bounce is constant. Once it is determined that the ground bounce is constant, if the amount of ground bounce is too large (Step S13) the sizes of both pass devices is decreased proportionally (Step S15) until the amount of ground bounce is within an acceptable range. The method just described may be performed using a sample device before the design is finalized or it may be performed by a circuit design simulator. The method just described may also be performed to determine the size of pass transistors 238 and 240 by sampling the bounce around $V_{cc}$ when pin 232 is pulled up to $V_{cc}$ by transistor 210.

Figure 10:
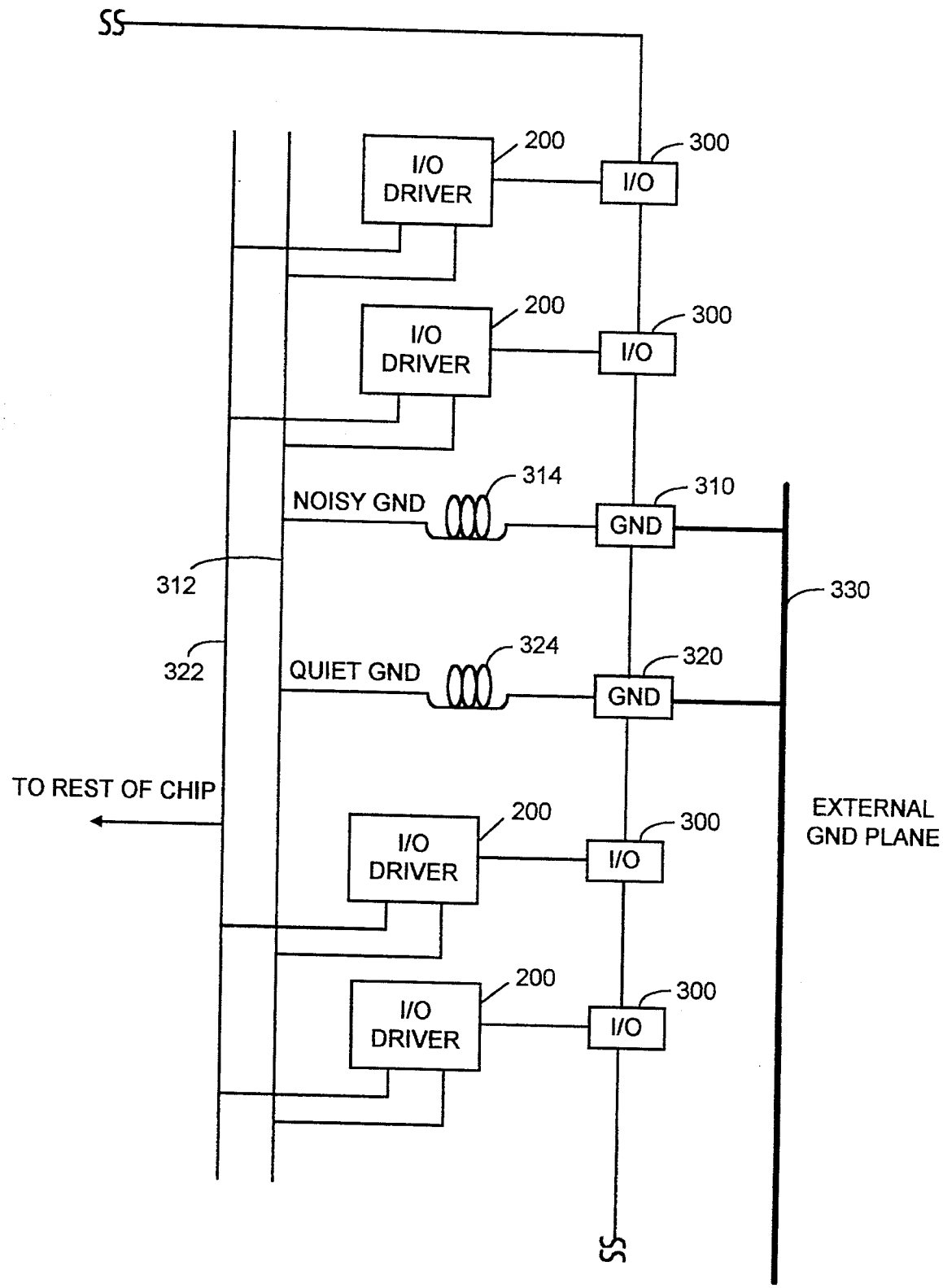
FIG. 10 is a schematic drawing of a chip with a number of ground bounce circuits according to the invention showing on-chip quiet and noisy ground busses coupled to an external ground.

FIG. 10 is an example of a chip incorporating a number of I/O drivers 200 according to the invention. I/O drivers 200 are each connected to one of external I/O pins 300. Each driver 200 is also connected to both an on-chip noisy ground line 312 and an on-chip quiet ground line 322. On-chip ground lines 312 and 322 are connected to a common external ground 330 through pins 310 and 320 respectively. Parasitic inductance 314 and 324 associated with the external ground pins 310 and 320 filter any noise signal on noisy ground line 312 from quiet ground line 322.

The above description is illustrative and not restrictive. Many variations of the invention will become apparent to those of skill in the art upon review of this disclosure. Merely by way of example, the conductivity types of various transistors in the circuit could readily be changed without departing from the scope of the invention. The scope of the invention should, therefore, be determined not with reference to the above description, but instead should be determined with reference to the appended claims along with their full scope of equivalents.

What is claimed is:

1. A CMOS output driver having a single mode of operation comprising:

an NMOS pull-down transistor, said NMOS pull-down transistor having a drain coupled to an output of said output driver and a source coupled to a first ground;

a PMOS pull-up transistor, said PMOS pull-up transistor having a source coupled to a first power supply and a drain coupled to said output;

a first pass device coupled to a gate of said NMOS pull-down transistor, said pass device having a first terminal coupled to said gate of said NMOS pull-down transistor and a second terminal coupled to an input of said output driver said first pass device comprising:

an NMOS pass transistor with its source connected to said first terminal and its drain connected to said second terminal; and a PMOS pass transistor with its source connected to said first terminal and its drain connected to said second terminal, wherein said NMOS pass transistor and said PMOS pass transistor are sized such that the sum of the currents through them is approximately inversely linearly proportional to the gate to source voltage on said NMOS pull-down transistor minus a threshold voltage of said NMOS pull-down transistor; and an output enable input coupled to the gates of said pass device, whereby a rate of change of a gate voltage of said NMOS pull-down transistor decreases with an increase in said gate voltage when said pull-down transistor is turned on by an input signal and said output enable input.

2. An output driver as recited in claim 1 wherein the pass device is a CMOS pass device.

3. An output driver as recited in claim 2 further comprising a second CMOS pass device coupled to a gate of said PMOS pull-up transistor, said second pass device having a first terminal coupled to a gate of said PMOS pull-up transistor and a second terminal coupled to an input of said output driver, said second pass device comprising:

a PMOS pass transistor with its source connected to said first terminal and its drain connected to said second terminal; and an NMOS pass transistor with its source connected to said first terminal and its drain connected to said second terminal, wherein said NMOS pass transistor and said PMOS pass transistor are sized such that a sum of currents through them is approximately inversely linearly proportional to a gate to source voltage on said pull-up transistor minus the threshold voltage of said pull-up transistor.

4. An output driver as recited in claim 1 further comprising:

a PMOS control transistor connected between a second power supply and a gate of said PMOS pull-up transistor, a gate of said PMOS control transistor coupled to said output enable input; and an NMOS control transistor connected between a second ground and a gate of said NMOS pull-down transistor, a gate of said NMOS control transistor coupled to an inverse of said output enable input, whereby said output enable input may be used to tri-state said output of said driver.

5. An output driver as recited in claim 1 wherein said input signal is an output from a programmable logic device.

6. An output driver as recited in claim 1 wherein said first power supply is a noisy power supply and said second power supply is a quiet power supply, wherein said noisy power supply provides power to circuit elements that are less sensitive to noise or that generate noise said noisy power supply coupled to sources of said PMOS pull-up transistor, said noisy and quiet power supplies isolated from one another to prevent noise on said noisy power supply from affecting said quiet power supply.

7. An output driver as recited in claim 1 wherein said first ground is a noisy ground and said second ground is a quiet ground, wherein said noisy ground provides ground connection to circuit elements that are less sensitive to noise or that generate noise said noisy ground coupled to sources of said NMOS pull-down transistor said noisy and quiet grounds isolated from one another to prevent noise on said noisy power ground from affecting said quiet ground.

8. An output driver as recited in claim 1 wherein said pass device is a CMOS pass device having said output enable input and an inverted output enable input as inputs, said output enable input generated from said inverted output enable through a first inverter and said inverted output enable generated from a second inverter.

9. An output driver as recited in claim 1 further comprising:

a first inverter and a second inverter coupled between said output enable input and said pass device wherein the capacitances of the outputs of the inverters are small compared to the gate-drain capacitance of the NMOS pass transistor such that the NMOS pass transistor is "bootstrapped" when said input signal rises.

10. A CMOS output driver circuit having a single mode of operation comprising:

an output terminal;

a first inverter the output of which is a first control signal;

a second inverter the output of which is a second control signal, said second control signal being the inverse of said first control signal;

a first PMOS transistor;

a second PMOS transistor having its drain coupled to said output terminal, its source coupled to a first reference voltage, and its gate coupled to a drain of said first PMOS transistor and to an output of a first CMOS pass device, said first CMOS pass device including a first NMOS transistor and a third PMOS transistor, wherein first terminals of said first NMOS transistor and said third PMOS transistor are tied together at said output of said first CMOS pass device, wherein second terminals of said first NMOS transistor and said third PMOS transistor are tied together at an input of said first CMOS pass device and wherein a gate of said third PMOS transistor is tied to an output of said second inverter wherein said second inverter has a capacitance which is smaller than the capacitance of said gate of said third PMOS transistor and wherein said first NMOS transistor and said third PMOS transistor are selected such that the sum of currents through them is approximately inversely linearly proportional to a gate to source voltage on said second PMOS transistor minus a threshold voltage of said second PMOS transistor;

a second NMOS transistor having its drain coupled to said output terminal, its source coupled to ground, and its gate coupled to the drain of a third NMOS transistor and to an output of a second CMOS pass device, said second CMOS pass device including a fourth NMOS transistor and a fourth PMOS transistor, wherein first terminals of said fourth NMOS transistor and said fourth PMOS transistor are tied together at said output of said second CMOS pass device, and wherein second terminals of said fourth NMOS transistor and said fourth PMOS transistor are tied together at an input of said second CMOS pass device and wherein a gate of said fourth NMOS transistor is tied to an input of said second inverter wherein said second inverter has a capacitance which is smaller that the capacitance of said gate of said fourth NMOS transistor and wherein said fourth NMOS transistor and said fourth PMOS transistor are selected such that the sum of the currents through them is approximately inversely linearly proportional to the gate to source voltage on said second NMOS transistor minus the threshold voltage of said second NMOS transistor; and a data input terminal coupled to said inputs of said first and second CMOS pass devices, wherein said first and second control signals are coupled to said CMOS pass devices, said first PMOS transistor and said third NMOS transistor to alternately couple and decouple input of said output driver to said output terminal.

11. The driver recited in claim 9 wherein said first control signal is coupled to the gates of said first NMOS transistor, said fourth NMOS transistor and said first PMOS transistor and said second control signal is coupled to the gates of said third PMOS transistor, said fourth PMOS transistor and said third NMOS transistor.

12. A method for selecting sizes of pass transistors in an output driver so as to reduce ground bounce but maintain a high switching speed, said output driver comprising:

an NMOS pull-down transistor, said NMOS pull-down transistor having a drain coupled to an output of said output driver and a source coupled to ground;

a PMOS pull-up transistor, said PMOS pull-up transistor having a source coupled to a voltage supply and a drain coupled to said output;

a first pass device coupled to a gate of said NMOS pull-down transistor, said pass device having a first terminal coupled to said gate of said NMOS pull-down transistor and a second terminal coupled to an input of said output driver said first pass device comprising:

an NMOS pass transistor with its source connected to said first terminal and its drain connected to said second terminal; and a PMOS pass transistor with its drain connected to said first terminal and its source connected to said second terminal; and an output enable input coupled to said pass device, whereby a rate of change of a gate voltage of said NMOS pull-down transistor decreases with an increase in said gate voltage when said pull-down transistor is turned on by an input signal and said output enable input; said method comprising the steps of:

driving said output terminal to ground;

sampling the electrical signal on said output terminal to determine the ground bounce characteristics;

detecting whether said ground bounce is constant;

upon determining that said ground bounce is constant, comparing said ground bounce to a predetermined voltage to determine if said ground bounce is too large;

upon determining that said ground bounce is too large, reducing the sizes of said pass transistors proportionally;

detecting whether said ground bounce peaks early and then gradually diminishes;

upon determining that said ground bounce peaks early and then gradually diminishes reducing the size of said NMOS pass transistor and increasing the size of said PMOS pass transistor;

detecting whether said ground bounce increases gradually;

upon determining that said ground bounce increases gradually reducing the size of said NMOS pass transistor and increasing the size of said PMOS pass transistor.

13. The method according to claim 12 wherein said method is performed by a automatic circuit simulation and design system.

14. A method for controlling ground bounce in a NMOS pull-down transistor comprising the steps of:

connecting a gate of said NMOS pull-down transistor to a first terminal of a first NMOS pass device;

connecting a data input to a second terminal of said first NMOS pass device;

connecting a gate of said first NMOS pass device to a first control node which has a small parasitic capacitance compared to the capacitance between the gate and the data input terminal of said pass device such that a gate voltage of said NMOS pass device is bootstrapped above a data input voltage when said data input voltage changes from low to high;

connecting a gate of said NMOS pull-down transistor to a first terminal of a first PMOS pass device;

connecting said data input to a second terminal of said first PMOS pass device;

connecting a gate of said first PMOS pass device to a second control node which has a small parasitic capacitance compared to the capacitance between the gate and the data input terminal of said pass device such that a gate voltage of said PMOS pass device is bootstrapped above a data input voltage when said data input voltage changes from low to high;

such that the sum of the currents through said first NMOS pass device and said first PMOS pass device is approximately inversely linearly proportional to a gate to source voltage on said pull-down transistor minus a threshold voltage of said second pull-down transistor.

15. A CMOS output driver circuit having a single mode of operation comprising:

an output terminal;

a first control signal;

a second control signal, said second control signal being the inverse of said first control signal;

a first PMOS transistor;

a second PMOS transistor having its drain coupled to said output terminal, its source coupled to a first reference voltage, and its gate coupled to a drain of said first PMOS transistor and to an output of a first CMOS pass gate, said first CMOS pass gate including a first NMOS transistor and a third PMOS transistor, wherein first terminals of said first NMOS transistor and said third PMOS transistor are tied together at said output of said first CMOS pass gate, wherein second terminals of said first NMOS transistor and said third PMOS transistor are tied together at an input of said first CMOS pass gate;

a second NMOS transistor having its drain coupled to said output terminal, its source coupled to ground, and its gate coupled to the drain of a third NMOS transistor and to an output of a second CMOS pass gate, said second CMOS pass gate including a fourth NMOS transistor and a fourth PMOS transistor, wherein first terminals of said fourth NMOS transistor and said fourth PMOS transistor are tied together at said output of said second CMOS pass gate, and wherein second terminals of said fourth NMOS transistor and said fourth PMOS transistor are tied together at an input of said second CMOS pass gate; and a data input terminal coupled to said inputs of said first and second CMOS pass gates, wherein said first control signal is coupled to the gates of said fourth NMOS transistor, said first NMOS transistor, and said first PMOS transistor wherein said second control signal is coupled to the gates of said fourth PMOS transistor, said third PMOS transistor and said third NMOS transistor whereby a rate of change of a gate voltage of said second PMOS transistor decreases with an increase in said gate voltage when said second PMOS transistor is turned on by an input signal and by said first and second control signals and whereby a rate of change of a gate voltage of said second NMOS transistor decreases with an increase in said gate voltage when said second NMOS transistor is turned on by an input signal and by said first and second control signals;

wherein said first and second control signals alternately couple and decouple input of said output driver to said output terminal;

wherein said fourth NMOS transistor and said fourth PMOS transistor are sized such that the sum of the currents through them is approximately inversely linearly proportional to the gate to source voltage on said second NMOS transistor minus a threshold voltage of said second NMOS transistor; and wherein said first NMOS transistor and said third PMOS transistor are sized such that the sum of the currents through them is approximately linearly proportional to the gate to source voltage on said second PMOS transistor minus a threshold voltage of said second PMOS transistor.

* * * * *